United States Patent
Sato et al.

(10) Patent No.: US 8,018,448 B2
(45) Date of Patent: Sep. 13, 2011

(54) DISPLAY MODULE

(75) Inventors: Toshihiro Sato, Mobara (JP); Yoshiyuki Kaneko, Hachiouji (JP)

(73) Assignee: Hitachi, Ltd., Tokyo (JP)

( * ) Notice: Subject to any disclaimer, the term of this patent is extended or adjusted under 35 U.S.C. 154(b) by 326 days.

(21) Appl. No.: 12/426,368

(22) Filed: Apr. 20, 2009

(65) Prior Publication Data

US 2009/0201273 A1 Aug. 13, 2009

Related U.S. Application Data

(63) Continuation of application No. 11/264,050, filed on Nov. 2, 2005, now Pat. No. 7,525,525, which is a continuation of application No. 10/105,308, filed on Mar. 26, 2002, now Pat. No. 6,965,363.

(30) Foreign Application Priority Data

Mar. 28, 2001 (JP) ................................. 2001-092836

(51) Int. Cl.
G09G 3/32 (2006.01)
(52) U.S. Cl. ......... 345/206; 345/55; 345/76; 315/169.1; 315/169.4
(58) Field of Classification Search ............... 345/55, 345/76, 82, 83, 204, 205, 206; 315/169.1, 315/169.4
See application file for complete search history.

(56) References Cited

U.S. PATENT DOCUMENTS

| | | |
|---|---|---|
| 5,331,182 A | 7/1994 | Takimoto |
| 5,550,066 A | 8/1996 | Tang |
| 5,670,994 A | 9/1997 | Kawaguchi |
| 5,739,547 A | 4/1998 | Nomura |
| 5,929,474 A * | 7/1999 | Huang et al. .................. 257/292 |
| 5,952,789 A | 9/1999 | Stewart |
| 5,994,836 A * | 11/1999 | Boer et al. ..................... 313/504 |
| 6,359,606 B1 * | 3/2002 | Yudasaka ......................... 345/87 |
| 6,424,326 B2 | 7/2002 | Yamazaki |
| 6,501,226 B2 | 12/2002 | Lai |
| 6,512,556 B1 | 1/2003 | Sekiguchi |
| 6,690,110 B1 | 2/2004 | Yamada |

FOREIGN PATENT DOCUMENTS

| | | |
|---|---|---|
| JP | 4-328791 | 11/1992 |
| JP | 8-241048 | 9/1996 |
| JP | 11-109886 | 4/1999 |
| JP | 2000-357584 | 12/2000 |
| JP | 2001-109395 | 4/2001 |
| WO | WO98/36407 | 2/1999 |

* cited by examiner

*Primary Examiner* — Amare Mengistu
*Assistant Examiner* — Stacy Khoo
(74) *Attorney, Agent, or Firm* — Antonelli, Terry, Stout & Kraus, LLP.

(57) ABSTRACT

A display module includes a substrate. The substrate has a plurality of pixels, a signal line, a current supply line, and a data driving circuit. The pixel includes an emitting device and an active device, wherein the emitting device include a first electrode layer, an organic emitting layer formed on the first electrode layer, and a second electrode layer formed on the organic emitting layer, and the data driving circuit is disposed between a display area and a first side of the substrate on which an external terminal is placed. A third electrode layer is provided within a sealing area disposed between the display area and a second side of the substrate, and on a layer below the passivation film, and the second electrode layer is connected to the third electrode layer through a plurality of contact holes formed above the third electrode layer.

3 Claims, 12 Drawing Sheets

DISPLAY MODULE

CROSS REFERENCE TO RELATED APPLICATION

This application is a continuation of U.S. application Ser. No. 11/264,050, filed Nov. 2, 2005, now U.S. Pat. No. 7,525,525 which is a continuation of U.S. application Ser. No. 10/105,308, filed Mar. 26, 2002, now U.S. Pat. No. 6,965,363, the contents of which are incorporated herein by reference.

FIELD OF THE INVENTION

The present invention relates to an active matrix display module, especially, pertaining to such display module as being provided with pixels comprising such emitting devices as an EL (electro luminescence) device or a LED (light emitting diode) wherein light is emitted by conducting electric current through such an emitting layer as an organic semiconductor thin film and with pixels circuits to control the emitting operation of those pixels.

BACKGROUND OF THE INVENTION

Recently, the advent of advanced information network system in our modern life increases the demand for personal computers, car navigation systems, portable remote terminals and communication network equipment or the combined products thereof. For such products as mentioned above, such a display device as being thin in thickness, light in weight and of lower power consumption is suitable so that a liquid crystal display or a display module incorporating such electrooptic devices as a self-luminous EL device or LED therein are in practical use.

The latter display module is characterized in being good at visibility, possessed with wide viewing angle and being suitable for motion display due to its high response, which module is said to especially opt for image display. In particular, a display incorporating an organic EL device (also referred to as an organic LED device; hereinafter, referred to as OLED in abbreviation, where appropriate), the emitting layer of which device is made from organic matter, is highly expectable in accordance with the greater improvement of the luminous efficiency thereof and the progress of the network technology that enhances the feasibility of image communication. The OLED display is of diode structure in which an organic emitting layer is interposed between two pieces of electrodes.

As described below, the active matrix driving method in which thin film transistors (hereinafter, referred to as TFT where appropriate) serve as the switching devices of pixels is effective for enhancing the power efficiency of such OLED display as mentioned above. The operation of the OLED display by the active matrix driving method in the prior arts is disclosed in the Japanese Patent Application Laid-open Nos. HEI 4-328791 and 8-241048 or the U.S. Pat. No. 5,550,066, for instances, the driving voltage of which display is disclosed in the International Publication No. WO98/36407 and so forth.

The typical pixel structure of the OLED display comprises two thin film transistors or TFTs equivalent to a first and a second active devices, the first of which is a switching transistor while the second of which is a driver transistor, and a pixel driving circuit (hereinafter, referred to as a pixel circuit where appropriate) comprising one capacitor for a data signal storage device, which pixel circuit controls the emitting luminance of the OLED display. The pixels are disposed at the respective intersections of a matrix in which the data lines having M in number to which data signals (or image signals) are supplied and the scanning lines (hereinafter, referred to as gate lines where appropriate) having N in number are aligned in the arrangement of N lines×M rows.

To drive the pixels, the scanning signals (gate signals) are subsequently supplied to the gate lines having N in number so as to put the switching transistors into on-state condition, and one time of the vertical scanning operation is over within one frame period of Tf so as to freshly supply the on-state voltage to the first gate line.

In the above driving method, the time required for supplying the on-state voltage to one gate line is defined as Tf/N or below. Generally, the value of the one frame period of Tf is in the order of $1/60$ second in practical use. It should be noted that where one frame period is represented with two fields, one field period becomes equivalent to one half of the one frame period.

During the on-state voltage is supplied to a certain gate line, all the switching transistors that are connected to the corresponding data line are put into on-state condition, in synchronization with which the data voltage (image voltage) is simultaneously or subsequently supplied to the data lines having M rows in number, which arrangement is general in the active matrix liquid crystal display.

The data voltage, during the on-state voltage (hereinafter, referred to as "on" while the off-state is referred to as "off" where appropriate) is supplied to the gate line, is stored in storage capacitance (capacitor) so as to be maintained substantially as it is during the one frame period (or one field period). The voltage value of the storage capacitance regulates the gate voltage of the driver transistor.

Accordingly, the value of the current flowing through the driver transistor is controlled so as to put the light emission of the OLED under control. The response time for the OLED to begin emitting light upon the application of voltage thereto normally takes one μs or below so that it manages to follow the motion image of quick tempo. A current supply line is provided in order to supply the driver transistor with current, from which line the current for display in response to the data signal as stored in the storage capacitance is supplied.

The active matrix driving method realizes high efficient operation by performing light emission over the one frame period. The difference with the passive matrix driving method, in which the respective electrodes of the OLED diode are directly connected to the scanning line and the data line without the provision of any TFTs, is clear as follows.

In the passive matrix driving method, the current flows through the is OLED only during the short period when the scanning line is selected, so that emitting luminance corresponding to practically several times as many as the number of the scanning lines is required for obtaining the same luminance as that of the one frame period of the active matrix driving method with the light emission performed during such short period as mentioned above. Thus, it is unavoidable that the driving voltage and current in use enlarge, which causes large loss of power consumption such as heating so as to deteriorate power efficiency.

In view of the foregoing, it is found that the active matrix driving method is superior to the passive one in light of the reduction of power consumption.

SUMMARY OF THE INVENTION

The passive matrix driving display module as described above is provided with terminal pads that are intended for leading the scanning lines and data lines as a whole as crosswise disposed in a display region on the substrate out of the same region so as to be connected to a driving circuit, which circuit is connected to an external circuit. However, such terminal arrangement is hard to apply to an active matrix driving display module.

That is, the active matrix driving OLED display module is arranged such that current supply to capacitors to keep display over one frame period is carried out by connecting one electrode thereof to an output terminal of the switching transistors while connecting the other electrode thereof to either a common voltage line for the capacitors or a current supply line that supplies current to an OLED.

FIG. 9 is a block diagram to show one example of the prior OLED display module while FIG. 10 is an explanatory view to show the pixel arrangement of the module as shown in FIG. 9. This display module (image display module) is arranged on a substrate SUB made from such insulating material as glass such that a data driving circuit DDR, a gate driving circuit GDR and a current supply circuit CSS are disposed in the surrounding of a display section AR as surrounded by the dotted line in the drawing, in which section the plurality of data lines DL and the plurality of gate lines GL are aligned in a matrix.

The data driving circuit DDR includes a complementary circuit of an NP-channels thin film transistor TFT or a shift register circuit, a level shifter circuit and an analog switch circuit comprising a single (N or P) channel thin film transistor TFT. To note, the current supply circuit CSS may be modified into just a bus line while the current may be supplied from an external power source.

FIG. 9 shows a system in which a common voltage line COML for the capacitors is provided in the display section AR, to which common voltage line COML the other electrodes of the capacitors are connected. The common voltage line COML is led out to an external common voltage source from a terminal COMT of a common voltage supply bus line COMB. To note, another system is also known, in which system the capacitors are connected to a current supply line without the provision of the common voltage line.

As shown in FIG. 10, a pixel PX comprises a first thin film transistor TFT1 or a switching transistor, a second thin film transistor TFT2 or a driver transistor, a capacitor CPR and an organic light emitting diode OLED, which are disposed in the region surrounded by the data line DL and the gate line GL. The gate of the TFT 1 is connected to the gate line GL while the drain thereof is connected to the data line DL. The gate of the TFT2 is connected to a source of the TFT1, to which source one electrode (positive pole) of the capacitor CPR is connected.

FIG. 11 is a block diagram to further explain the arrangement of the display module as shown in FIG. 9, which module is provided with the pixel arrangement as shown in FIG. 10. The drain of the TFT2 is connected to a current supply line CSL while the source thereof is connected to a first electrode (positive electrode herein) AD of the organic light emitting diode OLED. The other electrode (negative pole) of the capacitor CPR is connected to the common voltage line COML ramified from the common voltage supply bus line COMB. The data line DL is driven by the data driving circuit DDR while the scanning line (or gate line) GL is driven by the gate driving circuit GDR. A current supply line CSL is connected to an external power source via a current supply bus line CSLB and by way of either a current supply circuit CSS as shown in FIG. 9 or a terminal.

In FIGS. 10 and 11, when the TFT1 is put into on-state condition upon the selection of one pixel PX by the gate line GL, a video signal supplied from the data line DL is stored in the capacitor CPR. Then, when the TFT1 is put into off-state condition, the TFT2 turns into on-state condition so that the current flows from the CSL to the OLED, which current keeps intact practically over one frame period. The current in conduction at this time is regulated by a signal charge stored in the capacitor.

The operation level of the capacitor CPR is regulated by the electric potential of the common voltage line COML, which controls the light emitting behavior of the pixel. The current issued out of the OLED flows from the cathode CD thereof to a current drain line that is not shown in the drawings.

The above system requires the provision of the common voltage line that gets through a portion of the pixel region, which causes the deterioration of a so-called aperture ratio and constraints the displaying brightness of the module on the whole from improving.

FIG. 12 is a block diagram to show another example of the prior OLED display module in the similar arrangement to that as shown in FIG. 11. The basic alignment of the TFT1 and TFT2 and the capacitor CPR comprising the respective pixels is the same as shown in FIG. 9, the difference with which lies in the fact that the other end of the capacitor CPR is connected to the current supply line CSL.

That is, when the TFT1 is put into on-state condition upon the selection of one pixel by the gate line GL, a video signal supplied from the data line DL is stored in the capacitor CPR, and when the TFT2 turns into on-state condition while the TFT1 is put into off-state condition, the current flows from the CSL to the OLED, which current keeps intact practically over one frame period (or one field period) in the same way as the example shown in FIG. 10. The current in conduction at this time is regulated by a signal charge stored in the capacitor CPR. The operation level of the capacitor is regulated by the electric potential of the current supply line CSL, which controls the light emitting behavior of the pixel.

In the prior display modules as described above with reference to FIGS. 9 through 12, the source electrode of the TFT2 equivalent to the first electrode (anode, for example, which is also referred to as the first electrode layer hereinafter) AD of the OLED is formed of a conductive thin film made from such as ITO (Indium Tin Oxide) and the first electrodes AD of the respective pixels PX are individually separated from one another.

The second electrode thereof CD comprising an emitting device (cathode, for instance, which is also referred to as the second electrode layer hereinafter) locates at the uppermost position of the diode so as to be exposed to the air, which might cause corrosion thereon. Normally, the second electrode layers are made of a film uniformly formed over the whole pixels, which requires electrical connection with an external circuit. In the event where a terminal that is intended for supplying electric current to this second electrode layer CD is extensively led out to the terminal section (terminal pad) of the substrate from the same layer, the vicinity of that terminal section is prone to corrosion owing to exposure to the air.

FIG. 13 is a sectional view of the structure of the vicinity of one pixel of the OLED display module. This display module is arranged by stacking up on the glass substrate SUB a polysilicone or preferably low temperature polysilicone semiconductor layer PSI, a first insulating layer IS1, a scanning or gate line (gate electrode) GL, a second insulating layer IS2, a source electrode SD formed of aluminum wiring, a third insulating layer IS3, a passivation film PSV, a first electrode layer AD, an organic emitting layer OLE and a second electrode layer CD one over another in this order.

Upon the selection of the thin film transistor (or driver transistor) comprising the polysilicone semiconductor layer PSI, the gate line GL and the source electrode SD, the organic emitting device comprising the first electrode AD in connection with the source electrode SD, the organic emitting layer OLE and the second electrode layer CD emits light, which light L is emitted out of the substrate SUB.

In this case, provided that there is corrosion or degradation partially found on the second electrode layer CD of the said pixel, the current is insufficiently supplied thereto or detours the said pixel so as to cause insufficient or null light emission, which results in such display faults as a so-called dot or region defect.

The present invention is to provide a display module that allows image to be displayed with high quality by improving a power supply mechanism to the second electrode layers comprising the pixels so as to prevent the same layers from being corroded.

To achieve this purpose, the present invention is arranged such that an electrode layer in connection with the second layer is provided on the substrate wherein the electrode layer is connected to the second electrode layer through a contact hole and the outgoing line of the second electrode layer is an underlying wiring coated with a passivation film on the substrate.

This arrangement provides a display module of high credibility that prevents cathode from being corroded and allows image to be displayed with high quality. The characteristic features of the display module according to the present invention lie in that:

(1) A pixel is provided in the respective intersections between a plurality of scanning lines and a plurality of data lines, which lines are aligned in a matrix within a display region on a substrate and a current supply line is provided to supply said pixel with current for display, wherein said pixel is provided with an active device that is selected by the scanning line, a data storage device that stores a data signal supplied from said data line when the active device is put into on-state condition and an emitting device that emits light by current supplied from the current supply line according to the data signal stored in the data storage device, wherein said emitting device comprises a first electrode layer, an organic emitting layer coated over the first electrode layer and a second electrode layer formed on the organic emitting layer, wherein an electrode layer is provided on the substrate, which layer is lower than the second electrode layer and coated with an insulating or passivation film and to which layer the second electrode layer is connected through a contact hole.

(2) The arrangement (1) further includes a first terminal pad that supplies the data signal to a data driving circuit from an external circuit, a second terminal pad that supplies a gate signal to a gate driving circuit and a third terminal pad that supplies current to a current supply bus line and a fourth terminal pad that connects the electrode layer in connection with the second electrode layer, which pads are provided in an outside of the display region of the substrate.

(3) The arrangement (2) further includes a current supply wiring that connects the current supply bus line commonly connecting the current supply lines to the third terminal pad and a wiring that connects the electrode layer in connection with the second electrode layer to the fourth terminal pad.

(4) Either the arrangement (1) or (2) is characterized in that the first to fourth terminal pads are provided in one side of the substrate.

(5) The arrangement (4) is further characterized in that the current supply wiring and the wiring that connects the electrode layer in connection with the second electrode layer to the fourth terminal pad are provided in a side adjacent to the said one side of the substrate.

(6) The arrangement (4) is further characterized in that the current supply wiring and the wiring that connects the electrode layer in connection with the second electrode layer to the fourth terminal pad are provided in respective sides adjacent to the said one side of the substrate.

(7) Either the arrangement (1) or (2) is further characterized in that the third and fourth terminal pads are provided in a first side of the substrate opposed to a second side thereof in which the first and second terminal pads are provided.

(8) Any one of the arrangements (2) to (7) is characterized in that the electrode layer in connection with the second electrode layer is provided outer than the current supply bus line commonly connecting the current supply lines on the substrate.

(9) Any one of the arrangements (2) to (7) is characterized in that the electrode layer in connection with the second electrode layer is provided outer than the current supply wiring connected to the current supply bus line on the substrate.

It should be appreciated that the present invention is not limited to the above arrangements and the embodiments as described below, but it can be modified into various manners within the scope of the accompanying patent claims. The other objects and arrangements of the present invention are clarified from the following description.

BRIEF DESCRIPTION OF THE PREFERRED EMBODIMENT

Hereinafter, the preferred embodiments of the present invention are described in details with reference to the accompanying drawings. The organic emitting layer of the respective pixels as described below is divided into one type that emits light with luminance in proportion to the value of the current and with a color (including white) inherent in an organic material in use so as to display monochrome or color image and the other type that incorporates a red, green, blue or other color filter into the organic layer to emit white light so as to display color image.

Figure 1:
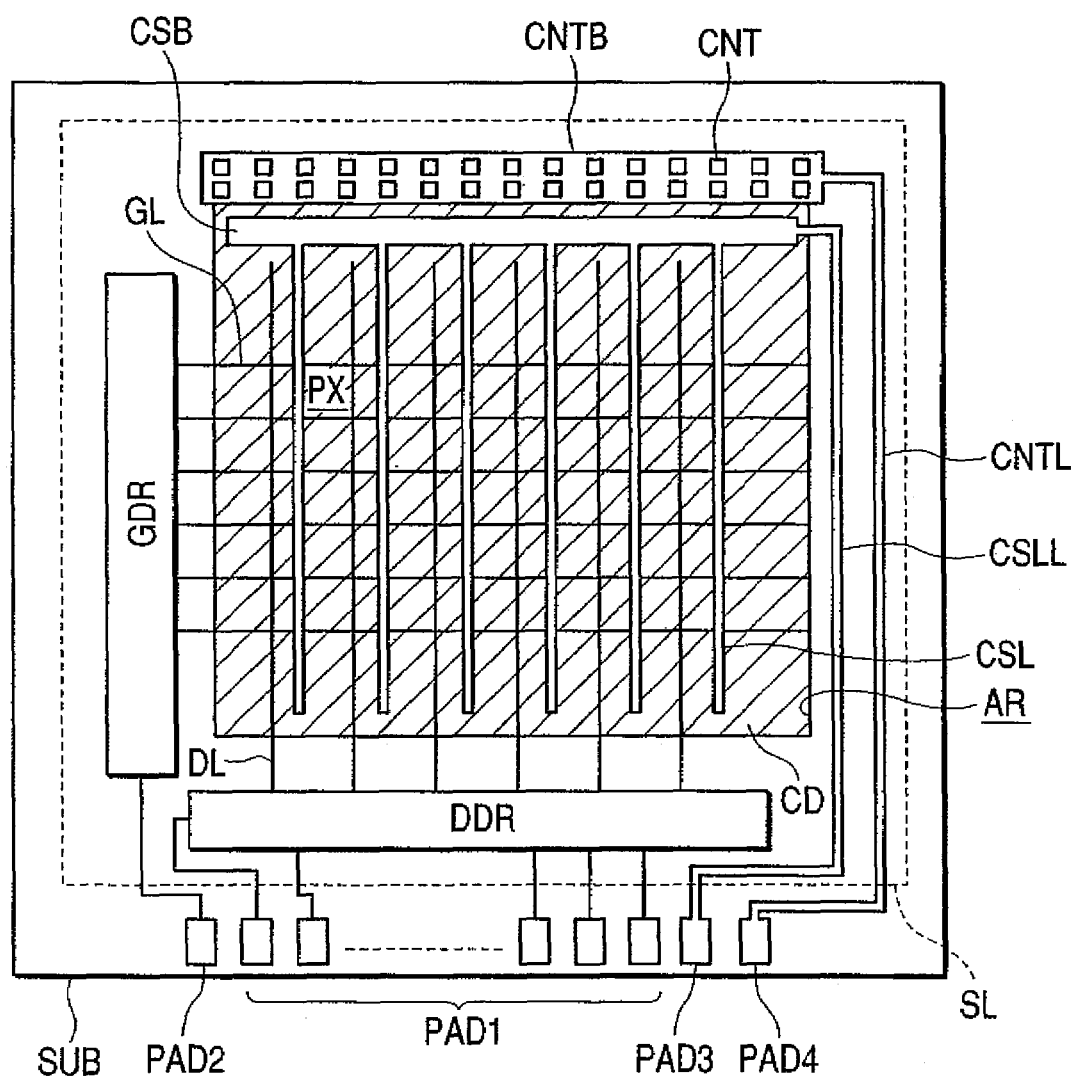
FIG. 1 is a block diagram to show the arrangement of a first embodiment of the display module according to the present invention.

FIG. 1 is a block diagram to show the arrangement of the first embodiment of the display module according to the present invention. The display module of this embodiment is provided with a gate driving circuit GDR and a data driving circuit DDR on the glass substrate SUB thereof.

Then, one pixel is formed within the region surrounded by scanning lines GL that are driven or scanned by the gate driving circuit GDR and a data line DL that is driven by the data driving circuit DDR, which lines are aligned in a matrix, and a current supply line CSL. In one side of the substrate SUB, terminal pads PAD1 and PAD2 are provided to supply signals and voltage to the gate driving circuit GDR and the data driving circuit DDR from an external circuit.

Figure 2:
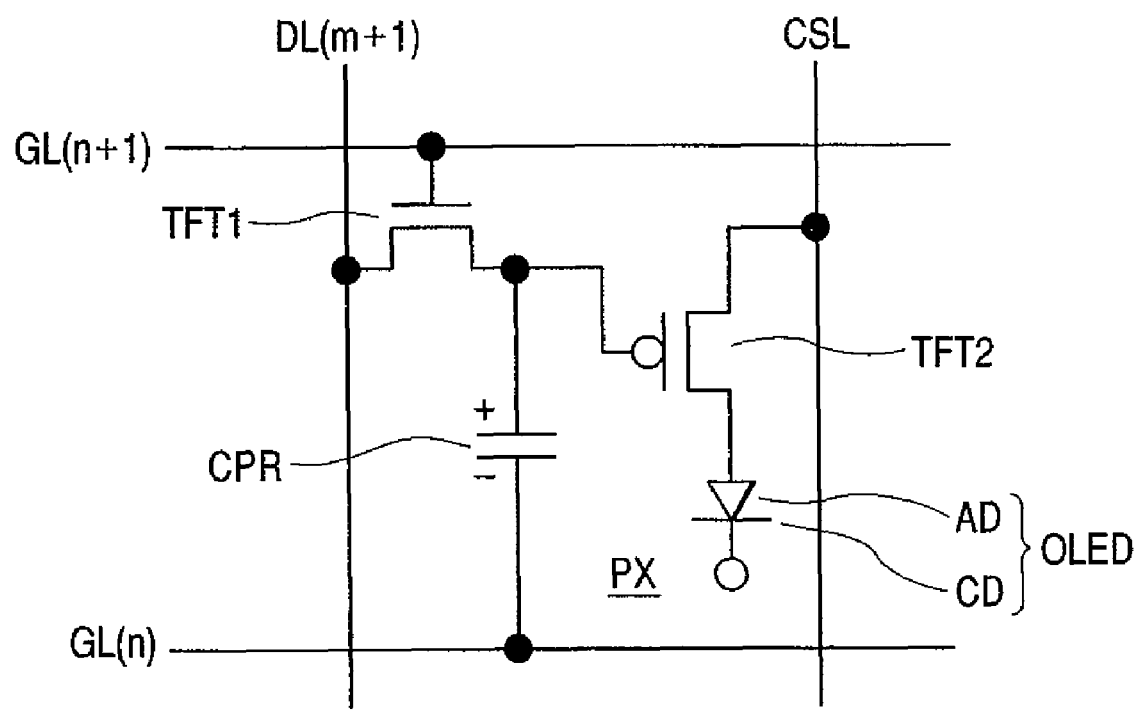
FIG. 2 is a view to show the arrangement of the pixel circuit corresponding to one pixel of the display module as shown in FIG. 1.

FIG. 2 is a view to show the arrangement of the pixel circuit corresponding to one pixel of the display module as shown in FIG. 1. In the present embodiment, one pixel is formed within the region surrounded by a data line DL (m+1), scanning lines GL (n+1) and GL (n) as well as the current supply line CSL. It is supposed herein that the scanning line that is being scanned or selected is the GL (n+1).

Attention is paid to one pixel PX among the plurality of pixels as selected by the scanning line GL (n+1). The first thin film transistor TFT1 is a switching transistor while the second thin film transistor TFT2 is a driver transistor, which transistors are active devices. The gate of the TFT1 is connected to the scanning line GL (n+1) while the drain thereof is connected to the data line DL (m+1) and the source thereof is connected to the gate of the TFT2.

The drain of the TFT2 is connected to the current supply line CSL, to which line the current is supplied from a current supply bus line CSB as shown in FIG. 1 while the source thereof is connected to a first electrode layer AD of an organic light emitting diode OLED. One terminal of a capacitor CPR serving as a data signal storage device is connected to a point where the source of the TFT1 and the gate of the TFT2 connect while the other terminal thereof is connected to the scanning line GL (n) right in front of the same.

In the arrangement of one pixel circuit as shown in FIG. 2, one terminal of the capacitor CPR that is connected to a point where the source of the TFT1 and the gate of the TFT2 connect is of positive pole while the other terminal thereof that is connected to the scanning line GL (n) is of negative pole.

The organic light emitting diode OLED is arranged by interposing an organic emitting layer, which is not shown in the drawings, between the first electrode layer AD and a second electrode layer CD wherein the first electrode layer AD is connected to the source of the TFT2 while the second electrode layer CD, which layer is uniformly formed over the whole pixels, is connected to an electrode layer in connection with the second electrode layer CNTB as shown in FIG. 1.

The electrode layer CNTB is a so-called current drain line (electrode), which layer is formed in a lower layer of the substrate or in the same layer as the terminal pads PAD1 and PAD2 and is connected to the second electrode layer CD through a contact hole CNT as well as to the terminal pad PAD4 formed in the same layer as the terminal pads PAD1 and PAD2 through a wiring CNTL.

The current supply line CSL that is a wiring of the first electrode layer is connected through a current supply bus line CSB and a current supply wiring CSLL to the terminal pad PAD3 formed in the same layer as the terminal pads PAD1 and PAD2. The electrode layer in contact with the second electrode layer CNTB is disposed on the substrate outer than the current supply bus line CSB and within a sealing area SL thereof as shown with the dotted line in the drawing.

The arrangement hereof as mentioned above that the electrode layer CNTB in contact with the second electrode layer CD through the contact hole CNT is disposed on the substrate outer than the current supply bus line CSB and within the sealing area thereof facilitates the layout design on a substrate especially when the internal circuits on a flexible print substrate are connected to the external circuit at one side thereof.

The data signal, which is written into the capacitor CPR and stored therein as charge amount when the TFT1 is put into on-state condition, flows electric current supplied from the current supply line CSL as the quantity of current controlled by the charge amount (indicating the gray scale of the data signal) as stored in the capacitor CPR to the organic light emitting diode OLED when the TFT2 turns into on-stage condition while the TFT1 is put into off-state condition.

The organic light emitting diode OLED emits light with luminance in proportion to the quantity of current as supplied and with a color inherent in the organic emitting layer material in use. In order to display color image, normally, the organic emitting layer material changes for the respective pixels of red, green and blue or the color filters of the respective colors are incorporated into the organic emitting layer material to emit white light.

To note, the data signal may be supplied in analog quantity or in time sharing digital quantity. The gray scale control may incorporate an area gray scale system wherein the pixel areas of red, green and blue respectively are divided.

The present embodiment is arranged such that the current flowing out of the current supply bus line CSB and the second electrode layer CD after the light emitting operation of the respective pixel circuits is discharged from the electrode layer CNTB or the current drain line, which layer or line is formed in a lower layer of the substrate and over the whole pixels, to the external circuit through the wiring CNTL and the terminal pad PAD4.

Thus, in this embodiment, the second electrode layer CD common in the whole pixels that is uniformly formed in an upper layer of the substrate is connected through the contact hole CNT to the electrode layer CNTB. The wiring CNTL is formed in the same layer as the electrode layer CNTB.

It is normal that the display module of this kind adopts a sealing structure by means of a can, for instance, in order to secure its function credibility. On the substrate SUB, the sealing area is provided for attaching such sealing can thereon, within which area the electrode layer CNTB and the wiring CNTL are disposed. The, at least the electrode layer CNTB is disposed outer than the current supply bus line CSB.

The electrode layer CNTB and so forth as mentioned above are formed in a lower layer of the substrate, on which an insulating or passivation film is laminated so that there is no case where the second electrode, the electrode layer in contact therewith preferably including the wiring CNTL have no contact with the air, which prevents them from being corroded and improves credibility, with the result that a display module with high quality display can be provided. It should be noted that the contact hole as mentioned above may well be only one, but the plurality of the contact holes are provided herein for the purpose of stably supplying as much current as possible.

Figure 3:
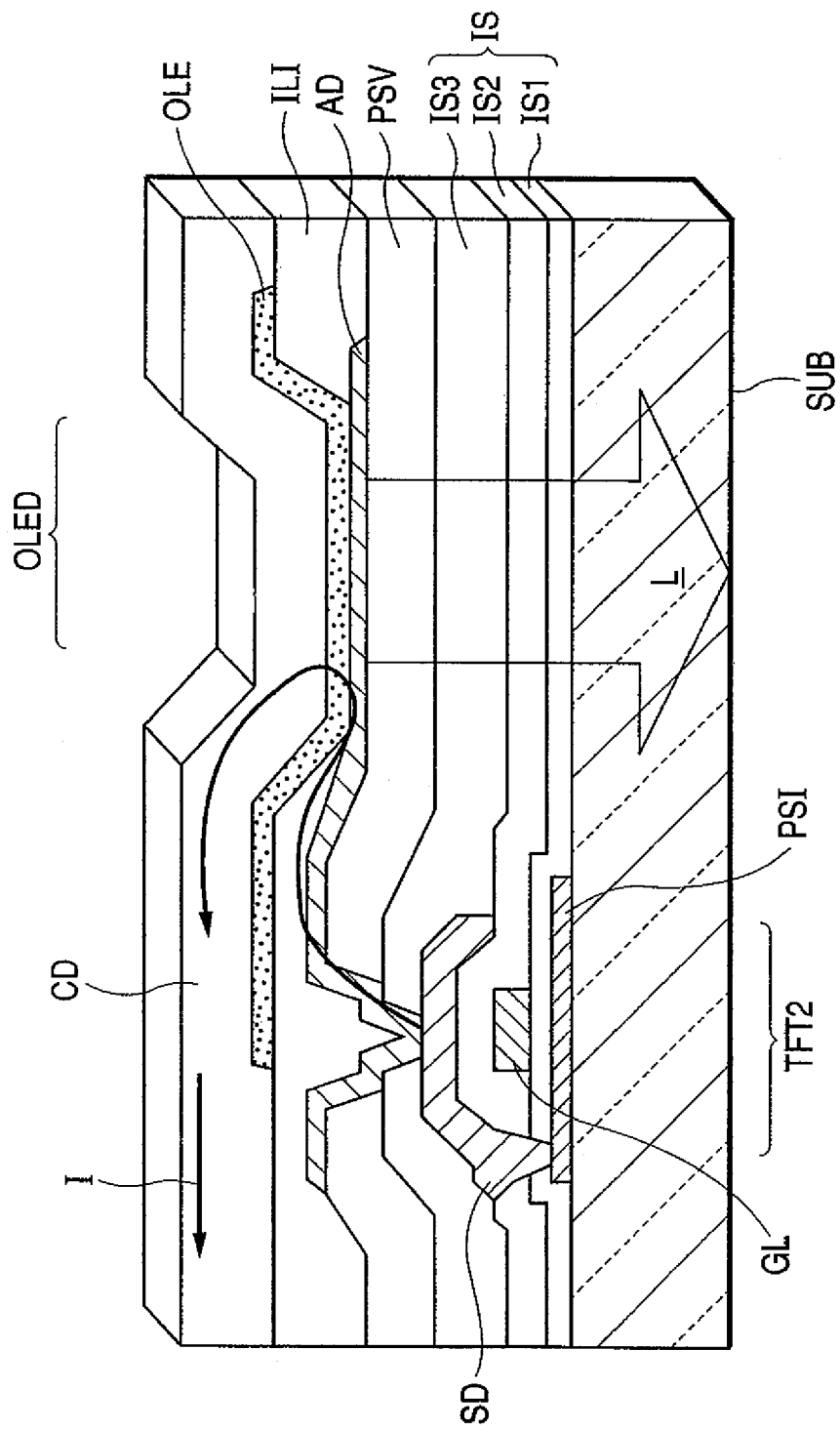
FIG. 3 is a view to show the vicinity of one pixel for explaining the light emitting mechanism of the display module according to the present invention.
Figure 4:
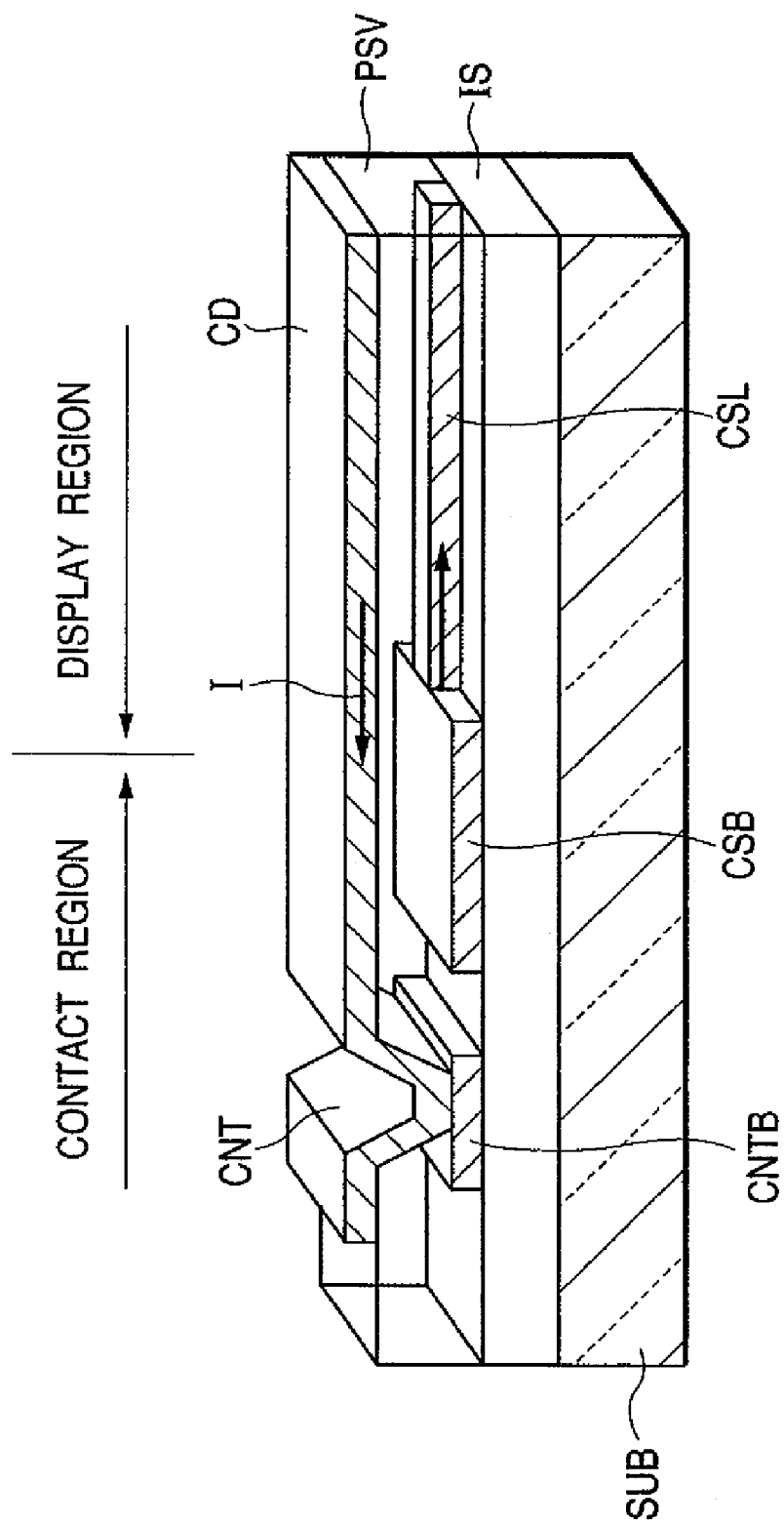
FIG. 4 is a view to show the state where the second electrode layer and the electrode layer in connection therewith are connected.

FIG. 3 is a view to show the vicinity of one pixel for the purpose of explaining the light emitting mechanism of the display module according to the present invention. FIG. 4 is a view to show the contact portion between the second electrode layer and the electrode layer in contact therewith. The same references of FIG. 1 correspond to the same elements. The arrow as indicated with the reference I in the drawings tracks the course of the current that contributes to the light emitting behavior.

The TFT2 is a driver transistor. Upon the selection of this TFT2 by the gate line GL, the current I having a value of the gray scale corresponding to the data signal as stored in the capacitor CPR is supplied from the current supply line ramified from the current supply bus line to the first electrode layer AD of the organic light emitting diode OLED through the TFT2.

The organic light emitting diode OLED emits light L having a spectrum corresponding to the emitting layer material OLE such that the electrons from the second electrode layer CD and the holes of the first electrode layer AD are rejoined inside the emitting layer OLE. The first electrode layers AD of the respective pixels are independent from each other while the second electrode layer CD is uniformly formed over the whole pixels. The current I conducted through the OLED from the TFT2 flows out to the terminal pad PAD4 via the wiring CNTL as shown in FIG. 1 by way of the second electrode layer CD and the electrode layer CNTB in contact therewith. A number of pixels as arranged above are aligned in a matrix so as to provide a two-dimensional display module.

Figure 5:
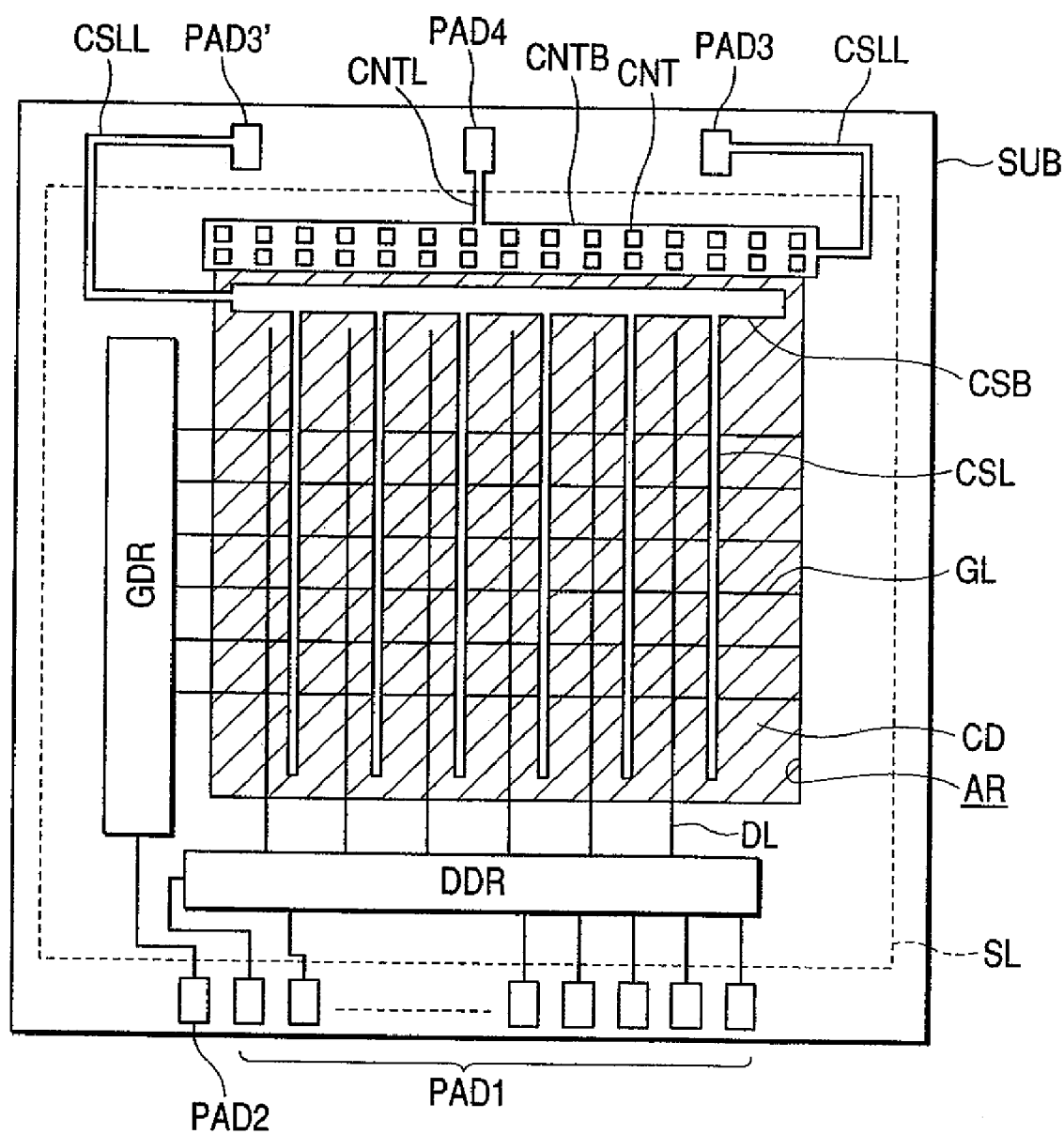
FIG. 5 is a block diagram to show the arrangement of a second embodiment of the display module according to the present invention.

FIG. 5 is a block diagram to show the arrangement of the second embodiment of the display module according to the present invention. The same references of FIG. 1 correspond to the same elements. This embodiment is arranged such that the two terminal pads PAD3 and PAD3' of the current supply bus line CSB connecting the current supply lines CSL as well as the terminal pad PAD4 of the electrode layer in contact with the second electrode layer CNTB are provided in a side of the substrate as opposed to that where the terminal pad PAD1 of the data driving circuit and the terminal pad PAD2 of the gate driving circuit GDR are provided.

The arrangement hereof that the electrode layer CNTB in contact with the second electrode layer CD through the contact hole CNT is disposed on the substrate SUB outer than the current supply bus line CSB and within the sealing area thereof facilitates the layout design on the substrate.

According the present embodiment, the current supply wiring CSLL between the current supply bus line CSB and the terminal pads PAD 3 and PAD3' thereof becomes short in length on the substrate, which allows the current to be more uniformly supplied and drained. This makes the light emitting distribution within the display region uniform, which allows image to be displayed with high quality. To note, two sets of the current supply wiring CSLL are exemplified in this embodiment, but it may be any one of them. In the event where the current supply wiring CSLL is led out of the respective ends of the current supply bus line CSB, it brings a good effect on symmetry.

The arrangement hereof that the electrode layer CNTB in contact with the second electrode layer CD through the contact hole CNT is disposed on the substrate outer than the current supply bus line CSB and within the sealing region thereof facilitates the layout design on a substrate especially when the internal circuits are connected to the external circuit at the opposed two sides of the flexible print substrate.

The arrangement of the present embodiment allows the wiring pattern in the vicinity of the sealing region to reduce, which gets rid of obstacles to block UV rays upon the solidification of a sealing material so as to cause the sealing material to be effectively hardened. This secures the sealing of the module, which leads to the improved credibility thereof.

Figure 6:
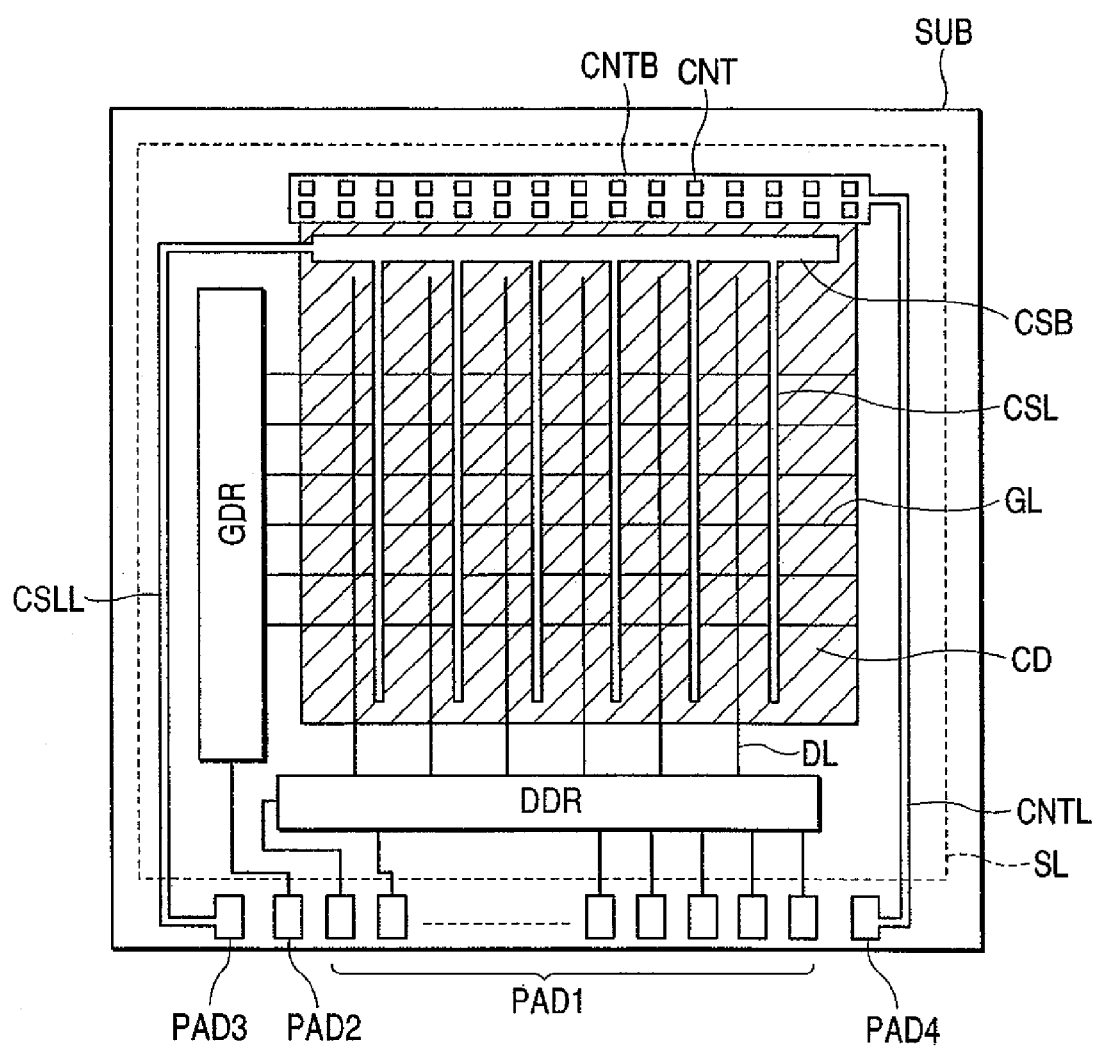
FIG. 6 is a block diagram to show the arrangement of a third embodiment of the display module according to the present invention.

FIG. 6 is a block diagram to show the arrangement of the third embodiment of the display module according to the present invention. The same references of FIG. 1 correspond to the same elements. The present embodiment is arranged such that the terminal pad PAD3 of the current supply bus line CSB connecting the current supply lines CSL and the terminal pad PAD4 of the electrode layer CNTB in contact with the second electrode layer are separately provided in the respective ends of one side of the substrate where the terminal pad PAD1 of the data driving circuit and the terminal pad PAD2 of the gate driving circuit GDR are disposed.

In the same way as the first and second embodiments, the electrode layer CNTB in contact with the second electrode layer CD through the contact hole CNT is disposed on the substrate outer than the current supply bus line CSB and within the sealing region thereof. The other arrangements hereof are the same as those of the first one as shown in FIG. 1, the explanation of which is omitted to avoid redundancy.

The arrangement hereof that the electrode layer CNTB in contact with the second electrode layer CD through the contact hole CNT is disposed on the substrate outer than the current supply bus line CSB and within the sealing region thereof facilitates the layout design especially when the internal circuits are connected to the external circuit at one side of the flexible print substrate.

Figure 7:
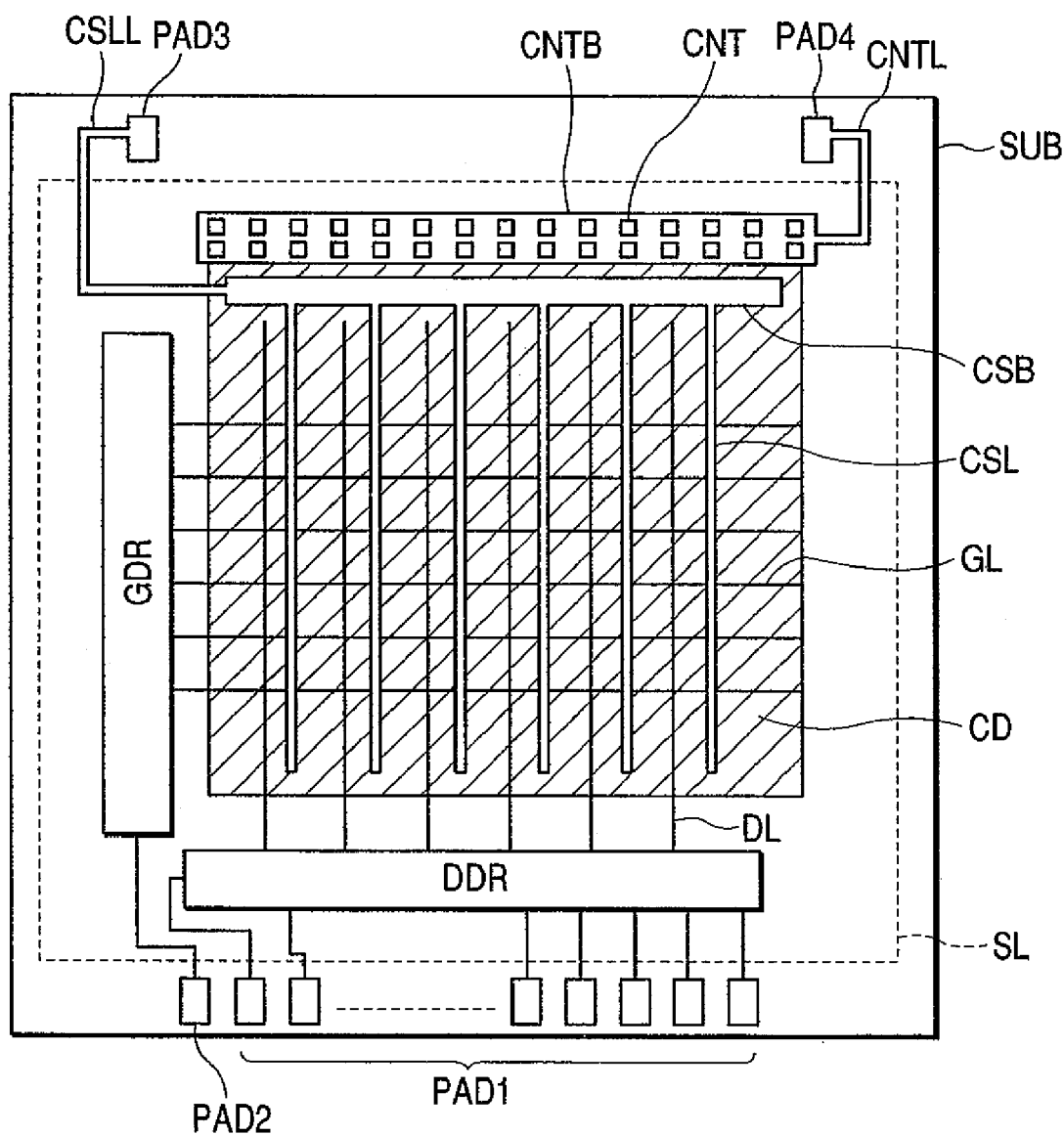
FIG. 7 is a block diagram to show the arrangement of a fourth embodiment of the display module according to the present invention.

FIG. 7 is a block diagram to shown the arrangement of the fourth embodiment of the display module according to the present invention. The same references of FIG. 1 correspond to the same elements. The present embodiment is arranged such that the terminal pad PAD3 of the current supply bus line CSB connecting the current supply lines CSL and the terminal pad PAD4 of the electrode layer CNTB in contact with the second electrode layer are provided in a side of the substrate as opposed to one side thereof where the terminal pad PAD1 of the data driving circuit and the terminal pad PAD2 of the gate driving circuit GDR are disposed.

In the same way as the first to third embodiments, the electrode layer CNTB in contact with the second electrode layer CD through the contact hole CNT is disposed on the substrate outer than the current supply bus line CSB and within the sealing region thereof.

The arrangement hereof that the electrode layer CNTB in contact with the second electrode layer CD through the contact hole CNT is disposed on the substrate outer than the current supply bus line CSB and within the sealing region thereof facilitates the layout on a substrate especially when the internal circuits are connected to the external circuit at the opposed two sides of the flexible print substrate. The other arrangements hereof are the same as the third embodiment as shown in FIG. 6, the explanation of which is omitted for redundancy.

According to the present embodiment, the current supply wiring CSLL between the current supply bus line CSB and the terminal pad PAD3 thereof and the wiring CNTL between the electrode layer CNT in contact with the second electrode layer CD and the terminal pad PAD4 thereof become short in length, which allows the current to be uniformly supplied and be drained. This makes the light emitting distribution within the display region uniform, which allows image to be displayed with high quality.

Then, the arrangement hereof allows the wiring pattern in the vicinity of the sealing area to reduce so as to get rid of obstacles to block UV rays upon the solidification of a sealing material, with the result that the sealing material can be effectively hardened. This makes the sealing of the module so as to further improve the credibility of the same.

In the second to fourth embodiments as described above, the current supply wiring CSLL and the wiring CNTL that amount to the course of the current occupy a wide area on the substrate with sufficient dimension in thickness, which makes the said secure and stable. Further, especially in the second and fourth embodiments wherein the distance with the terminal pads is short in length, it secures more stable course of the current.

Figure 8:
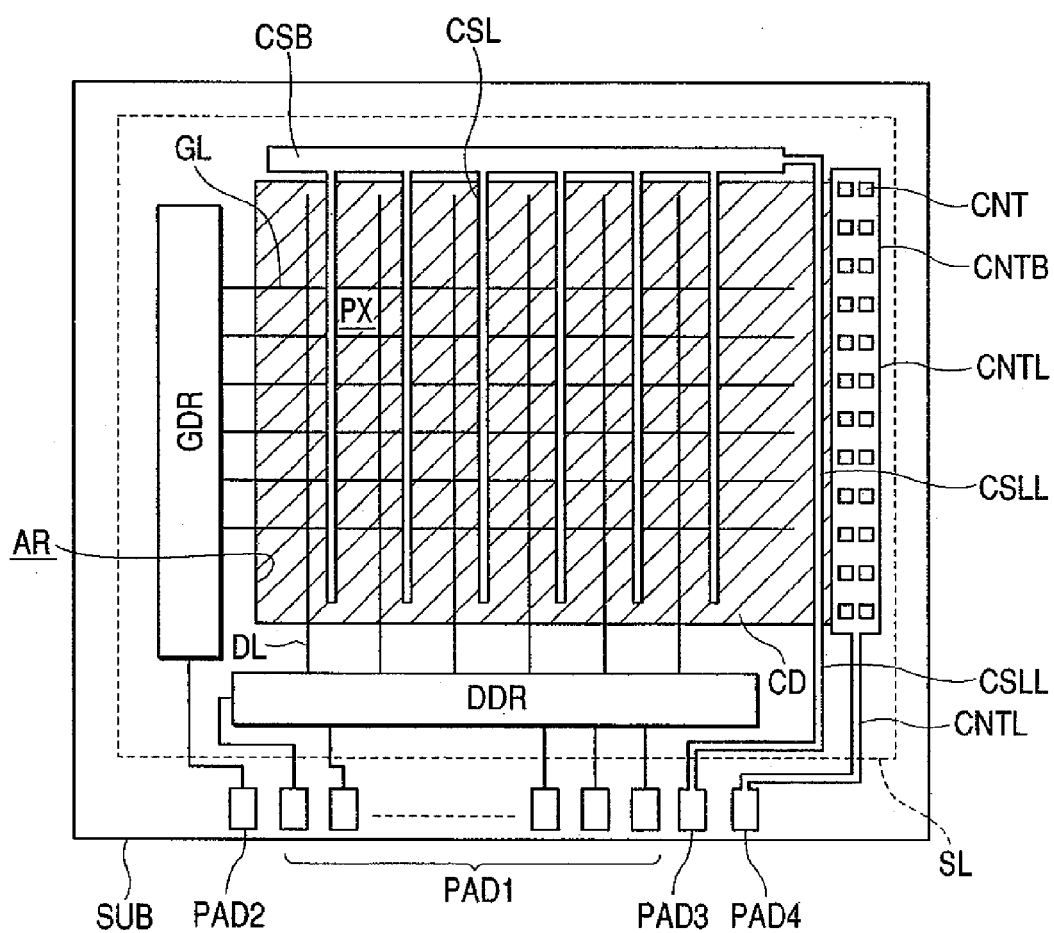
FIG. 8 is a block diagram to show the arrangement of a fifth embodiment of the display module according to the present invention.
Figure 9:
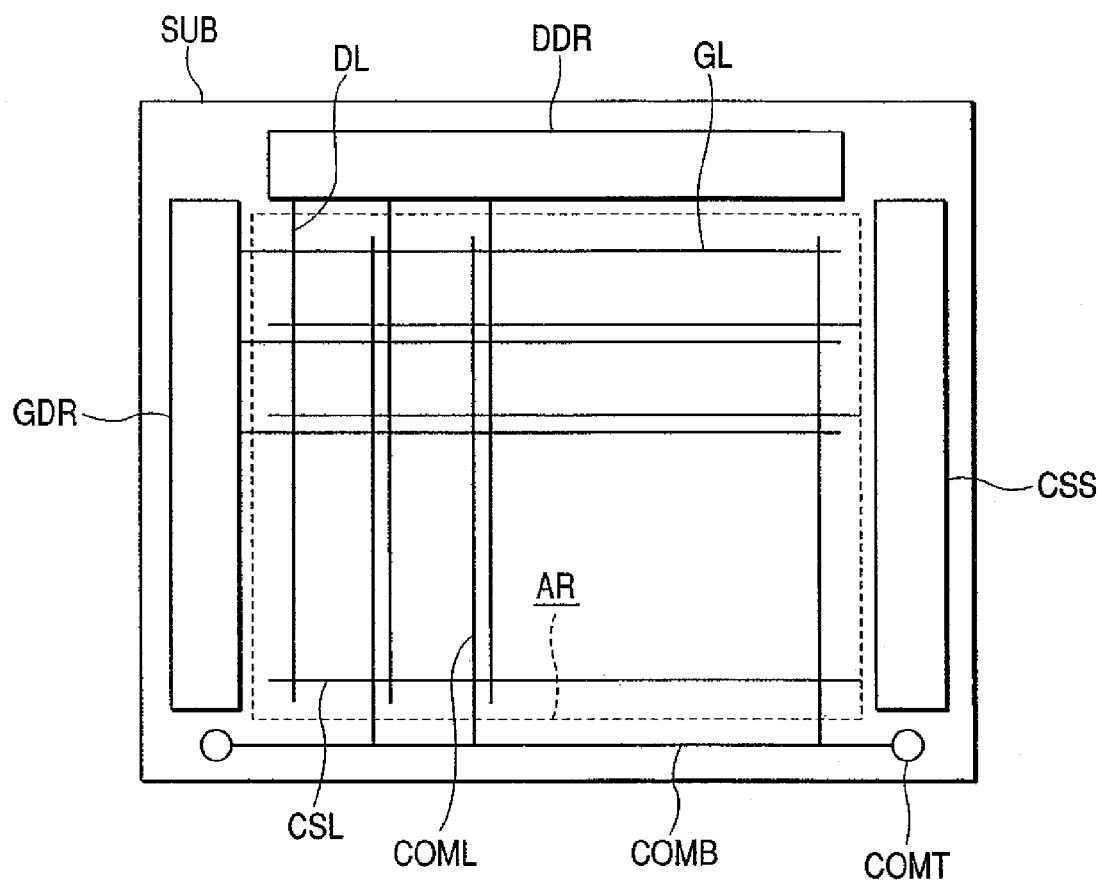
FIG. 9 is a block diagram to show the arrangement of one example of the prior OLED display module.
Figure 10:
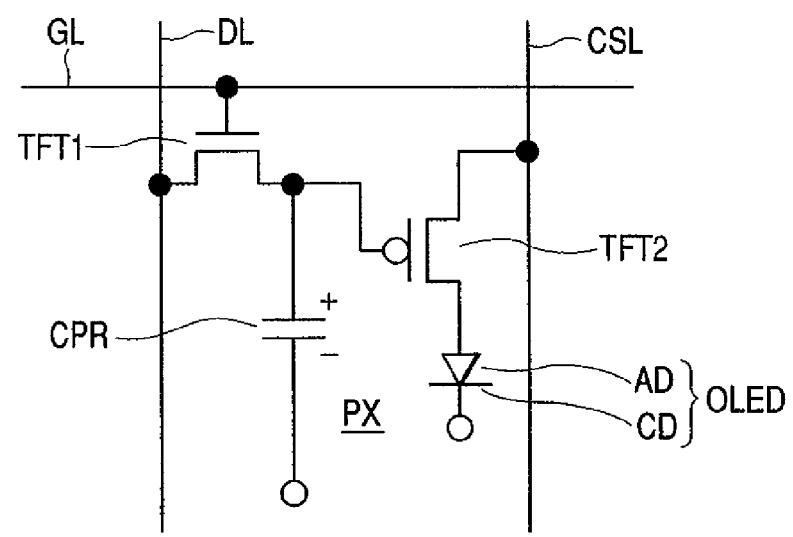
FIG. 10 is a view to show the arrangement of the pixel of the display module as shown in FIG. 9.
Figure 11:
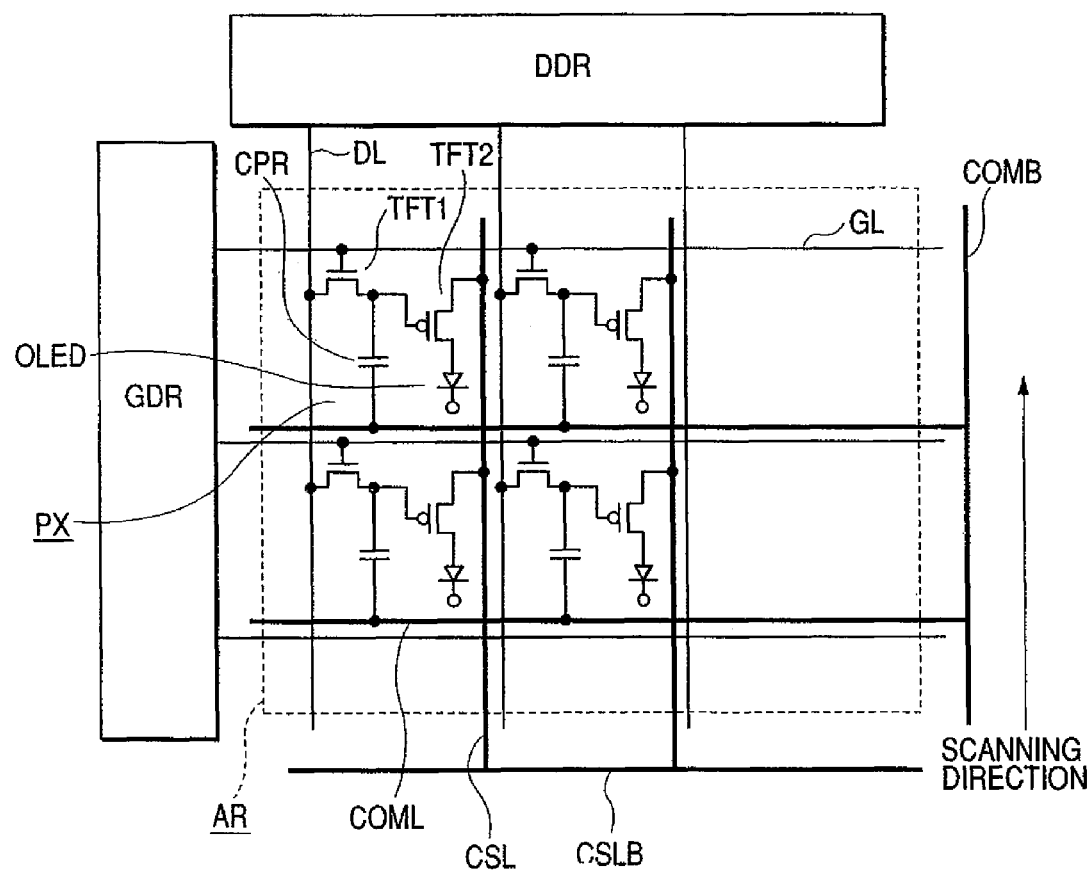
FIG. 11 is a block diagram to show the arrangement of the display module as shown in FIG. 9 and provided with the pixel arrangement as shown in FIG. 10 in more details.
Figure 12:
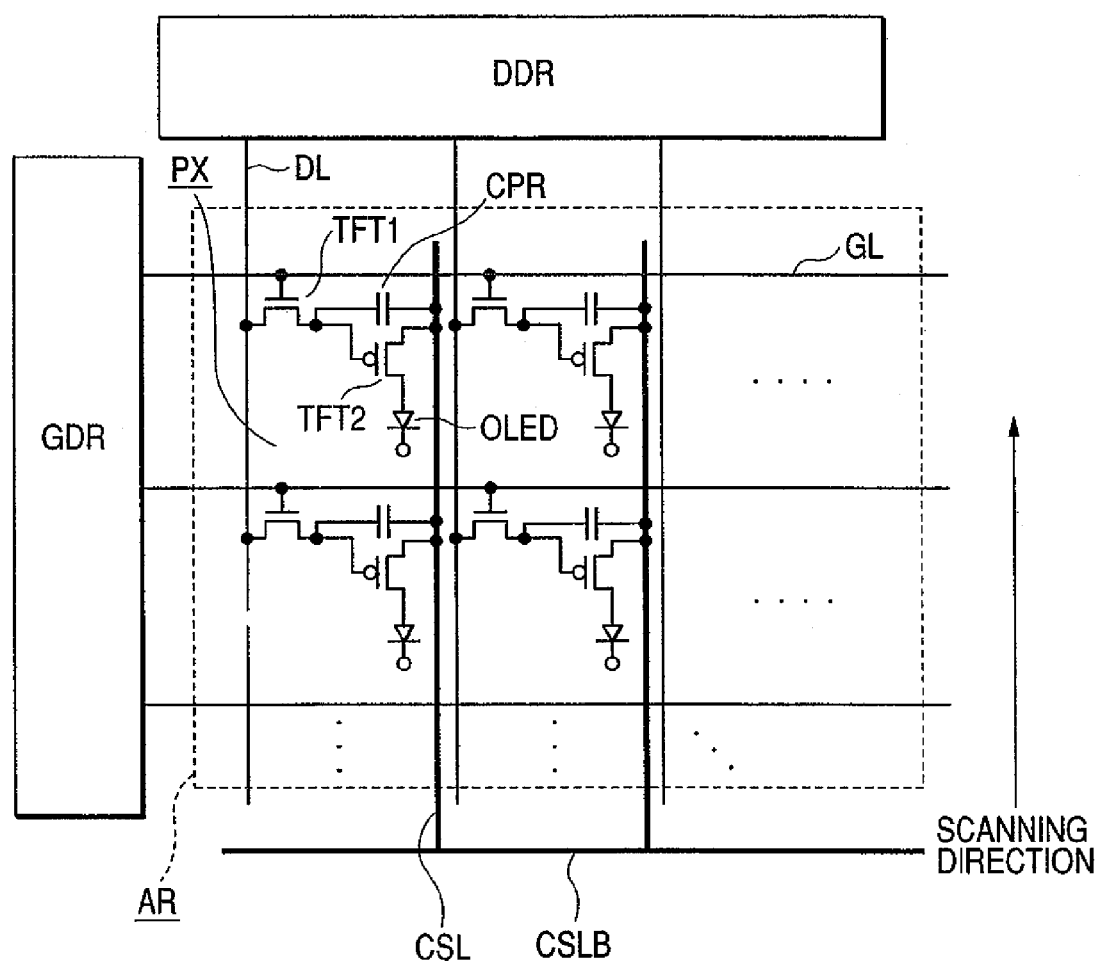
FIG. 12 is a block diagram like FIG. 11 to show the arrangement of another example of the prior OLED display module.
Figure 13:
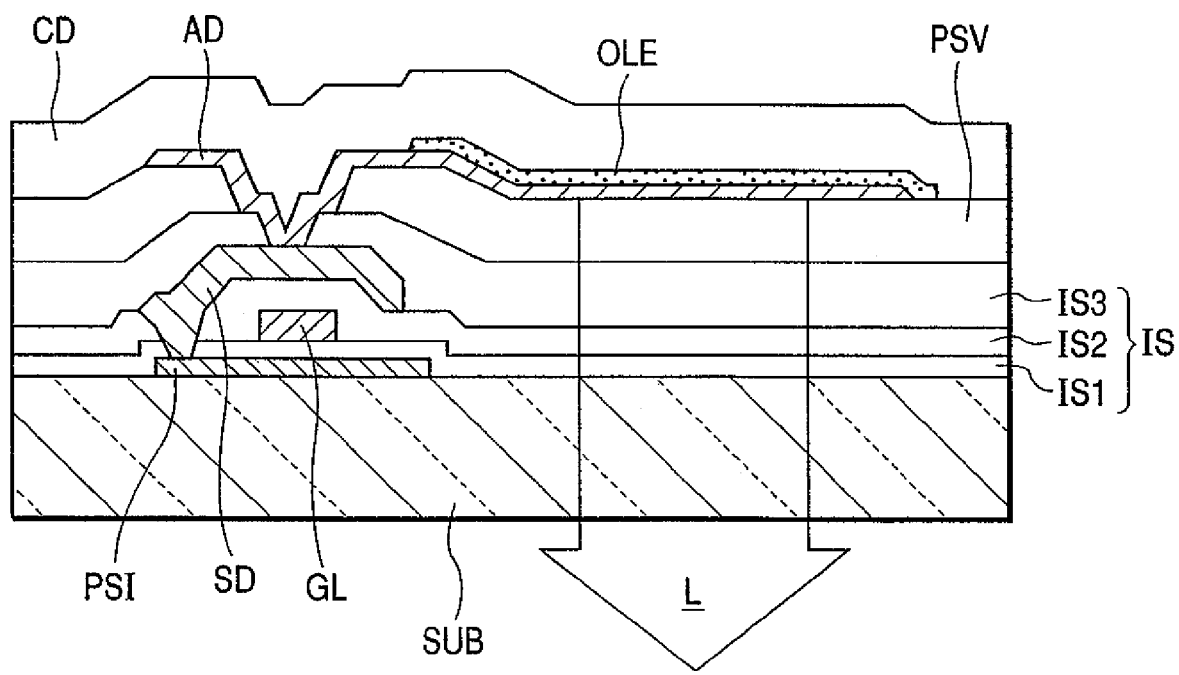
FIG. 13 is a sectional view to show the arrangement of the vicinity of one pixel of an OLED display module.

FIG. 8 is a block diagram to show the arrangement of the fifth embodiment of the display module according to the present invention. The same references of FIG. 1 correspond to the same elements. The present embodiment is arranged such that the electrode layer CNTB in contact with the second electrode layer is disposed in a side of the substrate, which side is adjacent to the side thereof where the terminal pads PAD1 to PAD4 are disposed and is as opposed to the side thereof where the gate driving circuit GDR is disposed, and outer than the current supply wiring CSLL.

The arrangement hereof that the electrode layer CNTB in contact with the second electrode layer CD through the contact hole CNT is disposed on the substrate outer than the current supply wiring CSLL to lead the current supply bus line CSB to the terminal pad PAD3 and within the sealing area thereof makes the symmetrical layout with the gate driving circuit GDR, which makes the whole layout of the substrate well balanced. The other arrangements hereof are the same as the first embodiment as shown in FIG. 1, the explanation of which is avoided for redundancy.

Further, according to the present embodiment, the wiring CNTL between the electrode layer CNTB and the terminal pad PAD4 thereof becomes short in length so as to allow the current to be uniformly supplied and drained. This makes the light emitting distribution within the display region uniform, which allows image to be displayed with high quality.

To note, in the respective embodiments as described above, the first and second electrode layers respectively correspond to the cathode layer and the anode layer, which can also correspond to vice versus in the present invention. Further, the present invention is not limited to the OLED display module as mentioned above, but it is also applicable to other display modules that perform the same emitting operation as the OLED counterpart.

As described above, according to the present invention, the electrode layers comprising the pixels of the display module and the vicinity of the terminal pads thereof are prevented from corrosion so as to dispense with display faults. Further, the current is stably and sufficiently supplied through the current supply line, so that the display module that allows image to be displayed with high quality is provided.

What is claimed is:

1. A display module comprising:
   a substrate;
   the substrate having a plurality of pixels, a signal line that supplies a data signal to a pixel, a current supply line that supplies electric current to the pixel, and a data driving circuit that supplies the data signal to a data line thereon;
   wherein the plurality of pixels includes a display area, and the pixel includes an emitting device and an active device;
   wherein the active device is disposed below the emitting device through a passivation film and is electrically connected to the current supply line, the data line, and the emitting device, and controls the electric current which flows between the current supply line and the emitting device according to the data signal;
   wherein the emitting device include a first electrode layer, an organic emitting layer formed on the first electrode layer, and a second electrode layer formed on the organic emitting layer;
   wherein the data driving circuit is disposed between the display area and a first side of the substrate on which an external terminal is placed;
   wherein a third electrode layer is connected to the second electrode layer, is provided within a sealing area of the substrate, is disposed between the display area and a second side of the substrate, and is provided on a layer below the passivation film;
   wherein the second electrode layer is connected to the third electrode layer through a plurality of contact holes formed above the third electrode layer.

2. The display module according to claim 1, wherein the second side of the substrate is disposed at a side of the substrate which is opposite to the first side of the substrate.

3. The display module according to claim 1, wherein the third electrode layer extends along a substantial portion of an extent of the display area between the display area and the second side of the substrate.

* * * * *